United States Patent [19]

Nishiguchi et al.

[11] Patent Number: 5,019,875
[45] Date of Patent: May 28, 1991

[54] SEMICONDUCTOR DEVICE RADIATION HARDENED MESFET

[75] Inventors: Masanori Nishiguchi, Kanagawa; Naoto Okazaki, Kyoto, both of Japan

[73] Assignee: Sumitomo Electric Industries, Ltd., Japan

[21] Appl. No.: 604,014

[22] Filed: Oct. 26, 1990

Related U.S. Application Data

[63] Continuation-in-part of Ser. No. 409,602, Sep. 19, 1989, abandoned.

[30] Foreign Application Priority Data

| Sep. 29, 1988 | [JP] | Japan | 63-245138 |
| Sep. 29, 1988 | [JP] | Japan | 63-245139 |
| Sep. 29, 1988 | [JP] | Japan | 63-245140 |
| Sep. 30, 1988 | [JP] | Japan | 63-246631 |

[51] Int. Cl.$^5$ .................................. H01L 29/80
[52] U.S. Cl. ............................... 357/22; 357/15
[58] Field of Search ............ 357/22 J, 22 K, 22 L, 357/22 A, 15, 22 G, 22 H, 16

[56] References Cited

U.S. PATENT DOCUMENTS

| H000,368 | 1/1987 | Yoder | 357/22 I |
| 3,763,408 | 10/1973 | Kano et al. | 357/22 K X |
| 4,336,549 | 6/1982 | Ladd, Jr. | 357/22 K X |
| 4,426,656 | 1/1984 | DiLorenzo et al. | 357/22 K |
| 4,444,732 | 9/1984 | Andrade | 357/22 I X |

Primary Examiner—William Mintel
Attorney, Agent, or Firm—Beveridge, DeGrandi & Weilacher

[57] ABSTRACT

This invention is for improving the radiation hardness or radiation resistance of GaAs MESFETs. According to this invention, an n-type active layer is formed by doping GaAs crystal evenly in the depth direction of the GaAs crystal, and a Schottky gate electrode is provided on the active layer, so that the carrier concentration in the active layer and the thickness of the active layer are set to required values. According to this invention, not only in the case of a total dose of exposure radiation of $R = 1 \times 10^9$ roentgens but also in the case of a higher total dose, at least one of the threshold voltage $V_{th}$ of the GaAs MESFET, the saturated drain current $I_{dss}$ thereof, and the transconductance $g_m$ will remain in their tolerable ranges. Consequently a semiconductor device comprising the GaAs MESFET and a signal processing circuit cooperatively combined therewith can operate normally as initially designed, with the result of conspicuously improved radiation hardness.

28 Claims, 11 Drawing Sheets

SEMICONDUCTOR DEVICE RADIATION HARDENED MESFET

RELATED APPLICATIONS

This is a continuation-in-part of our copending application Ser. No. 07/409,602 filed in Sept. 19, 1989, now abandoned, for A SEMICONDUCTOR DEVICE.

DETAILED DESCRIPTION OF THE INVENTION

Background of the Invention

This invention relates to a semiconductor device using a GaAs metal semiconductor field effect transistor (MESFET), specifically to that which can be used in machines and instruments requiring radiation tolerance, radiation hardness or radiation resistance.

Related Background Art

The devices which are used in aerospace systems and near nuclear furnaces are required to have high radiation hardness. The radiation includes gamma ($\gamma$) rays, neutron rays, proton rays, etc. Generally the gallium arsenide (GaAs) MESFETs and ICs based upon these FETs will withstand a total exposure dose of $1 \times 10^8$ roentgens with little if any change in characteristics. By contrast, silicon (Si) MOS circuits have failed at doses of $1 \times 10^6$ roentgens (Proceedings of Symposium of Space Development, 1987, ps. 35 to 38).

For improving the radiation hardness of the GaAs MESFET, the following devices have been proposed. In a first one, a p-type layer is buried below an n-type active layer to thereby decrease leakage current to the substrate, and the threshold voltage of a GaAs FET is improving in the radiation hardness. In a second one, the Schottky gate of a GaAs FET is shortened.

But these prior art devices have improved the radiation hardness up to a total exposure dose R of about $1 \times 10^8$ roentgens, but it cannot be said that these prior art devices have succeeded in attaining the sufficiently practical level ($1 \times 10^9$ roentgens). Under these circumstances, no practical transistor having a radiation resistance of about $1 \times 10^9$ roentgens has been realized.

Therefore an object of this invention is to provide a GaAs MESFET which has a simple structure and a high radiation hardness which has been improved by especially making use of changes of at least one of the threshold voltage, the saturated drain current, and the transconductance.

SUMMARY OF THE INVENTION

The inventors have noticed that when radiation is applied to a GaAs MESFET, the change amount $\Delta V_{th}$ of the threshold voltage $V_{th}$ in the saturation region, the change rate $\alpha = I_{dssA}/I_{dss}$ of saturated drain current at normal gate bias $I_{dss}$, and the change rate $\beta = g_{mA}/g_m$ of a transconductance $g_m$ has a constant relationship with the effective thickness $t_a$ of the active layer and the change amount $\Delta N_D$ of the carrier concentration $N_D$, and has found that the change amount $\Delta N_D$ has a constant quantitative relationship with the total exposure dose R. Based on this finding, they have completed this invention.

That is, this invention relates to a semiconductor device including a MESFET having an active layer doped substantially evenly in the depth direction of a GaAs crystal to have a carrier concentration $N_D$, and having a threshold voltage $V_{th}$, and which normally operates when at least one of three conditions that a change $\Delta V_{th}$ of the threshold voltage $V_{th}$ of the MESFET is within a tolerable change amount $\Delta V_{thL}$, a change rate of the saturated drain current $I_{dss}$ is within a tolerable change rate $\alpha_L$, and a change rate $\beta$ of the transconductance $g_m$ is a tolerable change rate $\beta_L$ are satisfied, when $\Delta N_D$ represents a decreased amount of the carrier concentration of the active layer due to the radiation exposure of a total dose R equal to or higher than $1 \times 10^9$ roentgens, $\mu$ and $\mu_A$ represent carrier mobilities in the active layer respectively before and after the radiation exposure, $\epsilon$ represents a dielectric constant of the active layer, and q represents an electron charge, at least one of the following three conditions an effective thickness $t_a$ of the active layer is given by $t_a < \{(2\epsilon \cdot \Delta V_{thL})/(q \cdot \Delta N_D)\}^{\frac{1}{2}}$ and, a carrier concentration $N_D$ of the active layer before the radiation exposure is given by $$N_D > \Delta N_D / \{1 - [\alpha_L (\mu/\mu_A)]^{\frac{1}{2}}\}.$$

$$N_D > \Delta N_D / \{1 - \beta_L (\mu/\mu_A)\}.$$

In this arrangement, under irradiation of a total exposure dose even below $1 \times 10^9$ roentgens, at least any one of the threshold voltage $V_{th}$, the saturated drain current $I_{dss}$, and the transconductance $g_m$ are within their corresponding preset ranges (tolerable ranges determined by the signal processing circuit). Consequently, the semiconductor device according to this invention comprising the GaAs MESFET and a signal processing circuit can operate normally as initially designed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

This invention will be explained in detail with reference to the drawings showing the principle and structure of this invention.

The semiconductor device according to this invention comprises a GaAs MESFET, and a signal processing circuit cooperatively combined with the MESFET. The MESFET and the signal processing circuit can provide combination circuits, e.g., amplifiers, inverters, oscillators, digital logic arrays, etc.

Figure 1:
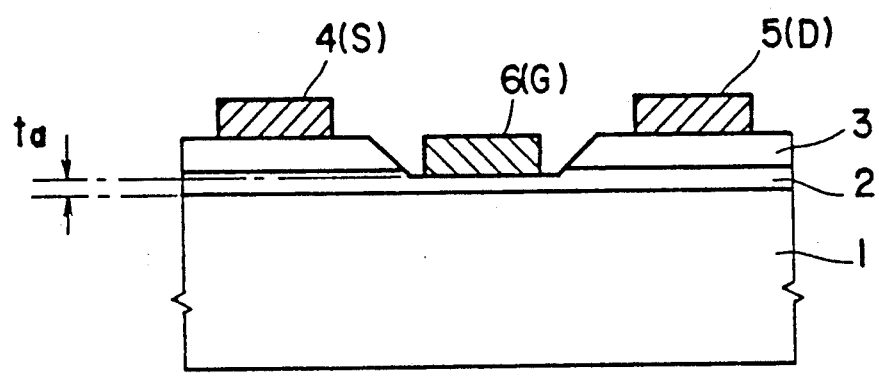
FIG. 1 is a sectional view of a GaAs MESFET explaining the principle of this invention.

FIG. 1 shows a sectional view of a GaAs MESFET having a recess gate structure. As shown in FIG. 1, an n-type GaAs active layer 2, and a heavily doped n-type (n+-type) GaAs contact region 3 are formed on a semi-insulating GaAs substrate 1. Parts of the n-type active layer 2 and the n+-type contact region 3 for a gate region to be provided are etched off to form a recess structure. Then a source electrode 4 and a drain electrode 5 of ohmic metal are formed on the n+-type contact region 3 by the vacuum evaporation. A gate electrode 6 of Schottky metal is formed on the n-type active layer 2. The part of the n-type active layer 2 directly below the gate electrode 6 has a sufficiently smaller thickness, compared with the n-type active layers of the conventional MESFETs, and the active layer 2 has a higher carrier concentration $N_D$, compared with the carrier concentrations of the conventional MESFETs.

The MESFET in this combination circuit involved in this invention has a preset threshold voltage $V_{th}$, a saturated drain current at normal gate bias $I_{dss}$, and a transconductance $g_m$ in the saturation region. It has been known that their values change under radiation exposure. When a changed threshold voltage $V_{thA}$, a changed saturated drain current $I_{dssA}$, and a changed transconductance $g_{mA}$ to which their initial values have changed due to radiation exposure are out of their preset ranges by the signal processing circuit, this combination circuit does not normally operate. Hereinafter in this specification, a tolerable value of a change amount $\Delta V_{th}$ of the threshold voltage $V_{th}$ is represented by a tolerable change amount $\Delta V_{thL}$. A tolerable value of a change rate $\alpha = I_{dssA}/I_{dss}$ of the saturated drain current $I_{dss}$ is represented by a tolerable change rate $\alpha_L$, and a tolerable value of a change rate $\alpha = g_{mA}/g_m$ of the transconductance is represented by a tolerable change rate $\beta_L$. The values of $\Delta V_{thL}$, $\alpha_L$ and $\beta_L$ vary depending on designs of the above described signal processing circuit, but generally $\Delta V_{thL}$ is equal to or lower than 0.2 V, and $\alpha_L$ and $\beta_L$ are equal to or higher than 0.8.

As described above, it is known that the threshold voltage $V_{th}$, etc. change under radiation exposure. Causes for these changes have been reported, firstly, decreases in a carrier concentration of the active layer due to radiation exposure, and secondly decreases in an electron mobility therein due to radiation exposure. The inventors discussed the first cause in detail and found the relationship $$\Delta N_D = b \cdot R^c \qquad (1)$$

where b and c are constants holds between a decreased amount of a carrier concentration $N_D$ and a total exposure dose R. Formula 1 holds when an initial carrier concentration $N_D$ (before radiation exposure) of the active layer is $1 \times 10^{17}$ to $1 \times 10^{19} \text{cm}^{-3}$, a total dose R of exposure radiation is $1 \times 10^8$ to $1 \times 10^{10}$ roentgens. The constants b and c have some ranges depending on changes of an initial carrier concentration of the active layer, qualities of the substrates, etc.

The values of the above-described constants b, c were given by the following two methods. In a first method, some samples of the GaAs MESFETs were prepared, and those samples were exposed to radiation to measure the change amounts $\Delta V_{th}$ of the threshold voltages. That is, since the relationship of Formula 5 which will be described below is given between the change amount $\Delta V_{th}$ and the carrier concentration decrease amount $\Delta N_D$, the relationship between the total dose R and the carrier concentration decrease amount $\Delta N_D$ can be given empirically by measuring the total dose R of radiation and the change amount $\Delta V_{th}$. Based on this relationship, the constants b, c in the above-described Formula 1 could be given.

According to the experiments conducted by the inventors, the constants b and c have ranges of $$1.99 \times 10^{10} \leq b \leq 3.98 \times 10^{10}$$

$$0.5 \leq c \leq 0.8$$

and the typical values are $b = 3.06 \times 10^{10}$, $C = 0.678$. Therefore, the typical value of the decreased amounts $\Delta N_D$ of the carrier concentration is defined by $$\Delta N_D = 3.06 \times 10^{10} \cdot R^{0.678}.$$

This first method is for measuring a change amount $\Delta V_{th}$ of the threshold voltage to calculate a carrier concentration decrease amount $\Delta N_D$ and accordingly for indirectly giving the relationship between the carrier concentration decrease amount $\Delta N_D$ and the total dose R. In contrast to the first method, in a second method, the relationship between the carrier concentration decrease amount $\Delta N_D$ and the total dose R is directly given. To this end, the Hall effect was measured.

First, a GaAs Hall element which has been made n-type by Si doping was prepared. The n-type GaAs layer was formed by epitaxial growth, and the carrier concentration distribution in the n-type GaAs layer is constant in the directions of the depth, length and width of the Hall element. A plurality of such samples having a 100 Å to 2 μm-thickness n-type GaAs layer and a $1 \times 10^{16} \text{cm}^{-3}$ to $5 \times 10^{18} \text{cm}^{-3}$-carrier concentration were prepared. The Hall effect was measured on these samples to give the carrier concentration and Hall mobility. Then when a carrier concentration is represented by N, and a carrier concentration change amount is indicated by $\Delta N$, a carrier extinction number is given by ΔN = N (before radiation) − N(after radiation).

According to these experiments, the constants b, c have an allowance of $5 \times 10^5 \leq b \leq 1 \times 10^6$ $1.0 \leq c \leq 1.3$.

The constant b is represented by $b = 6.65 \times 10^5$, and the constant c is represented by $c = 1.17$. Therefore, the representative value of the carrier concentration decrease amount $\Delta N_D$ is $\Delta N_D = 6.65 \times 10^5 \cdot R^{1.17}$.

As seen from the above, the first indirect measuring method and the second direct measuring method give different values of the constants b, c. The reason for the occurrence of such differences is presumed as follows. That is, in the indirect measurement in accordance with the first method, on the assumption of the following (a), (b) and (c), the carrier concentration decrease amount $\Delta N_D$ was calculated based on the actually measured values of the change amount $\Delta V_{th}$.

(a) The depth profile of the effective carrier concentration is constant over the active layer of the GaAs MESFET.

(b) The decrease in the effective carrier concentration occurs uniformly over the active layer, and the thickness remains unchanged for whole irradiations.

(c) The carrier mobility is not changed by γ-ray radiation.

In contrast to this, in the direct measure in accordance with the second method, the carrier concentration decrease amount $\Delta N_D$ was measured actually by the Hall effect, and the above-described assumption was not used. It is considered that due to this, the difference in the values of the constants b, c between the first and the second methods took place. But anyway it is doubtless that the above-described Formula 1 is given. In the following description, the result of the second method, i.e., the measurement of the Hall effect, is taken as the values of the constants b, c.

Figure 3:
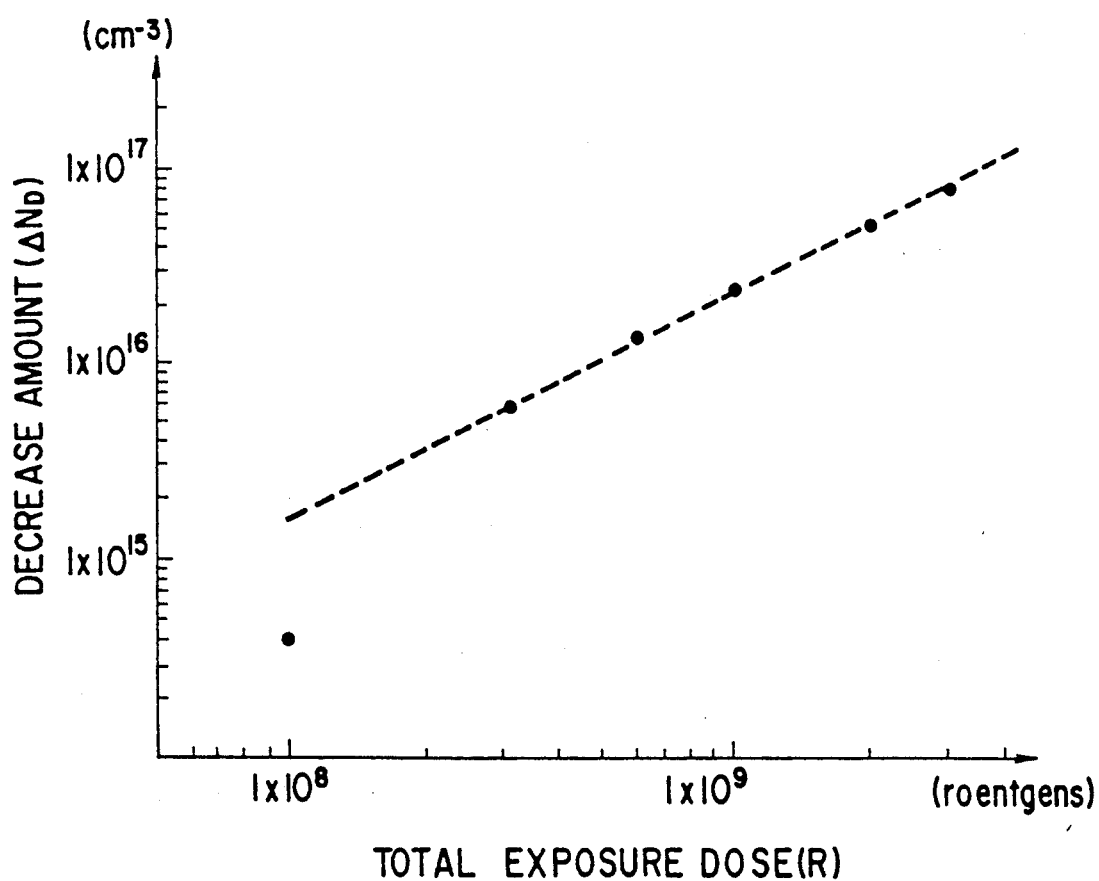
FIG. 3 is a graph showing the relationship of the total exposure dose R and a decrease amount $\Delta N_D$ of the carrier concentration.

The result of the measurement of the Hall effect is expressed in a two-dimensional logarithmic graph where γ-ray exposure dose is on the horizontal axis, and the carrier extinction number is on the vertical axis as shown by the dots in FIG. 3. The above-described Formula 1 expressed by $\Delta N_D = 6.65 \times 10^5 \cdot R^{1.17}$ as described above is plotted as indicated by the dotted line in FIG. 3.

The carrier concentration decrease amount $\Delta N_D$ can be given by the above-described Hall effect measurement, but the general relationship between the change amount $\Delta V_{th}$ of the threshold voltage $V_{th}$ of the GaAs MESFET and the carrier concentration decrease amount $\Delta N_D$ can be given theoretically as follows.

The theoretical value of the threshold voltage $V_{th}$ of this GaAs MESFET is given by $$V_{th} = V_{bi} - (q \cdot N_D \cdot t_a^2)/2\epsilon \qquad (2),$$

S. Sze, "Physics of Semiconductor Devices," 2nd ed. John Wiley and Sons, 1981, ps. 312 to 361. In Formula 2, $V_{bi}$ represents a built-in voltage of the MESFET; q, an electron charge; and $\epsilon$, a dielectric constant of the n-type active layer 2. When the carrier concentration $N_D$ of the n-type active layer 2 becomes $N_{DA}$ due to radiation exposure, a changed threshold voltage $V_{thA}$ after the radiation exposure is given by $$V_{thA} = V_{bi} - (q \cdot N_{DA} \cdot t_a^2)/2\epsilon \qquad (3).$$

A change amount $\Delta V_{th}$ of the threshold voltage $V_{th}$ due to the radiation exposure is given by $$\begin{aligned} \Delta V_{th} &= V_{thA} - V_{th} \qquad (4) \\ &= \{V_{bi} - (q \cdot N_{DA} \cdot t_a^2)/2\epsilon\} - \{V_{bi} - (q \cdot N_D \cdot t_a^2)/2\epsilon\} \\ &= \{(q \cdot t_a^2)/2\epsilon\} \cdot (N_D - N_{DA}). \end{aligned}$$

When a decreased amount of the carrier concentration due to radiation exposure is represented by $\Delta N_D$, $$\Delta V_{th} = \{(q \cdot t_a^2)/2\epsilon\} \cdot \Delta N_D \qquad (5).$$

In this Formula 5, the carrier concentration decreased amount $\Delta N_D$ can be given empirically by measuring Hall effect on the samples (Hall elements). Accordingly the theoretical value of the change amount $\Delta V_{th}$ of the threshold voltage can be given. Reversely, the change amount $\Delta V_{th}$ can be given experimentally using samples of the MESFET.

The inventors further studied the change amount $\Delta V_{th}$ of the threshold voltage $V_{th}$ by irradiation by gamma rays in total exposure doses $R = 1 \times 10^8$ roentgens, $1 \times 10^9$ roentgens and $3 \times 10^9$ roentgens to a MESFET of FIG. 1 having the active layer 2 of a thickness of 500 Å. The result is shown in FIG. 2 by black points.

Then, the above-described relationship given by measuring the Hall effect, $\Delta N_D = 6.65 \times 10^5 \cdot R^{1.17}$ is adapted to the MESFET of FIG. 1 to give the change amount $\Delta V_{th}$ of the threshold voltage $V_{th}$ using the above-described Formula 5. The result is as indicated by the dotted line in FIG. 2. The theoretical value of the change amount $\Delta V_{th}$ of the threshold voltage well agrees with the experimental value thereof.

Figure 2:
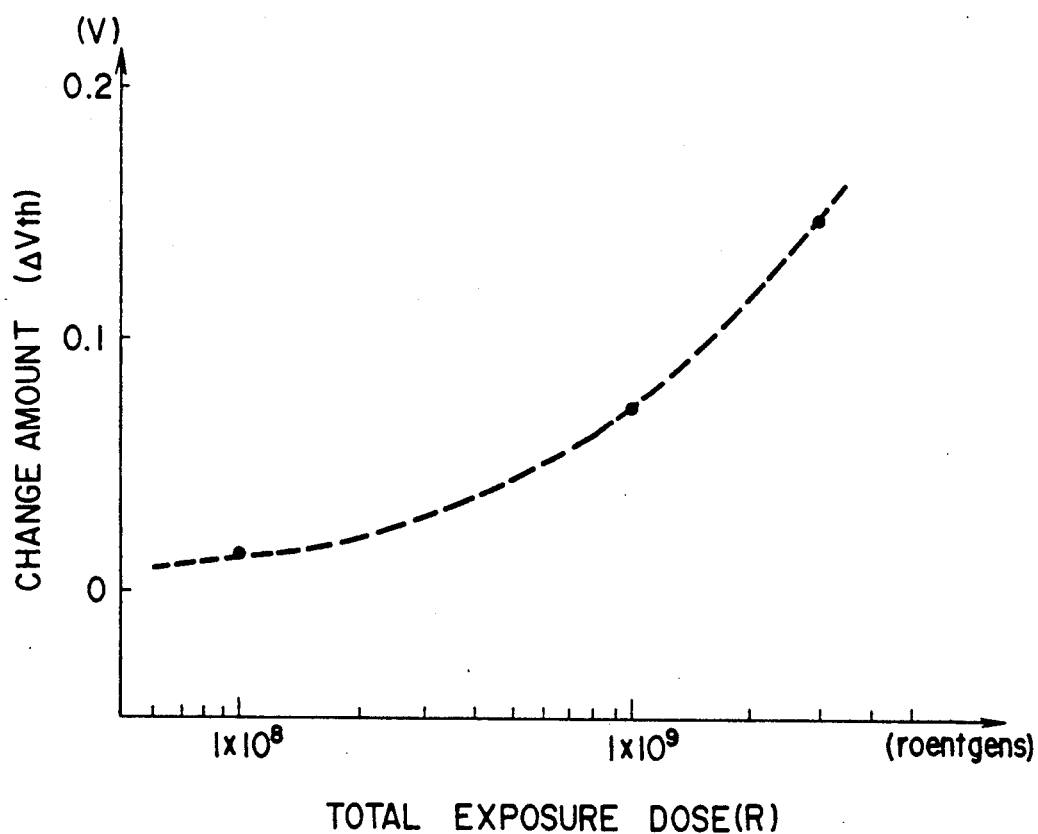
FIG. 2 is a graph showing the relationship of the total exposure dose R and a change amount $\Delta V_{th}$ of the threshold voltage of the MESFET involved in this invention.

In FIG. 2, with a total dose of $R = 1 \times 10^9$ roentgens, a change amount $\Delta V_{th}$ of the threshold voltage is as low as about 0.075 V. Therefore, it is confirmed that the radiation hardness is conspicuously improved when the active layer 2 has a thickness of about 500 Å.

Figure 4:
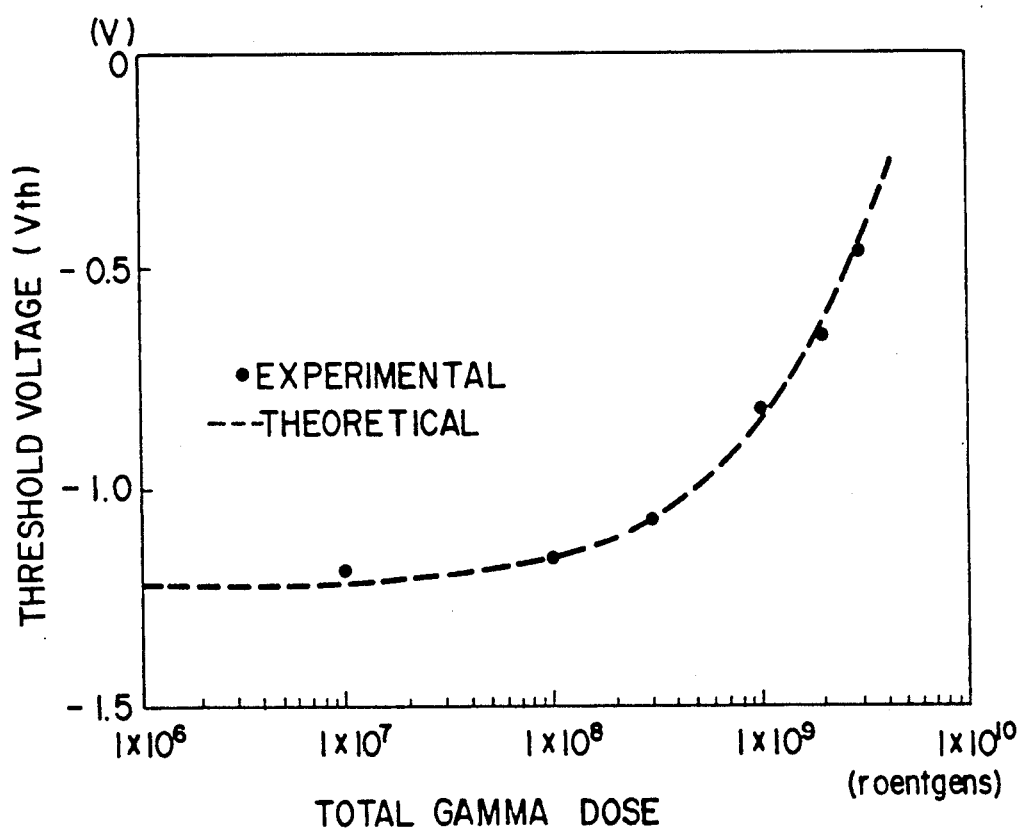
FIG. 4 is a graph showing the result of an experiment concerning the relationship of the total exposure dose R and a change amount $\Delta V_{th}$ of the threshold voltage of a conventional MESFET.

Formula 1 described above was derived from actually measured values for six total doses of $R = 1 \times 10^8$ roentgens, $3 \times 10^8$ roentgens, $6 \times 10^8$ roentgens, $1 \times 10^9$ roentgens, $2 \times 10^9$ and $3 \times 10^9$ roentgens. It can be said that these values are insufficient data to derive a general formula. Then the inventors conducted a further experiment of irradiation by gamma rays from cobalt 60 to a conventional GaAs MESFET having the same geometrical structure as the GaAs MESFET according to this embodiment, having the active layer 2 in an effective thickness $t_a$ of 1130 Å so that the carrier concentration $N_D$ is $2.09 \times 10^{17} \text{cm}^3$. In this experiment, total doses were $R = 1 \times 10^6$ roentgens, $1 \times 10^7$ roentgens, $1 \times 10^8$ roentgens, $3 \times 10^8$ roentgens, $1 \times 10^9$ roentgens, $2 \times 10^9$ roentgens and $3 \times 10^9$ roentgens. The resultant change amounts $\Delta V_{th}$ of the threshold voltage are shown in FIG. 4 by the black points. These points well agree with the theoretical values indicated by the dotted line. The change amounts $\Delta V_{th}$ after a radiation exposure of $R=1\times 10^9$ roentgens, however, was about 0.4 V, which was remarkably inferior to that in FIG. 2.

The results of these experiments on the threshold voltage show the following. Firstly, a major cause for the degradation of the threshold voltage of the MESFET due to radiation damage is a decrease in the carrier concentration of the active layer, and it was found that Formula 1 well expresses a decrease in the carrier concentration under the radiation exposure. Secondly, it has found that the change amount $\Delta V_{th}$ of the threshold voltage $V_{th}$ can be set at a required value by setting only the thickness $t_a$ of the active layer. Specifically, as shown in FIG. 4, when the thickness $t_a$ of the active layer 2 is set at about 1000 Å as in the conventional MESFETs, the radiation hardness is insufficient, but as shown in FIG. 2, when the thickness $t_a$ is set at 500 Å, the radiation hardness is conspicuously improved.

Figure 5:
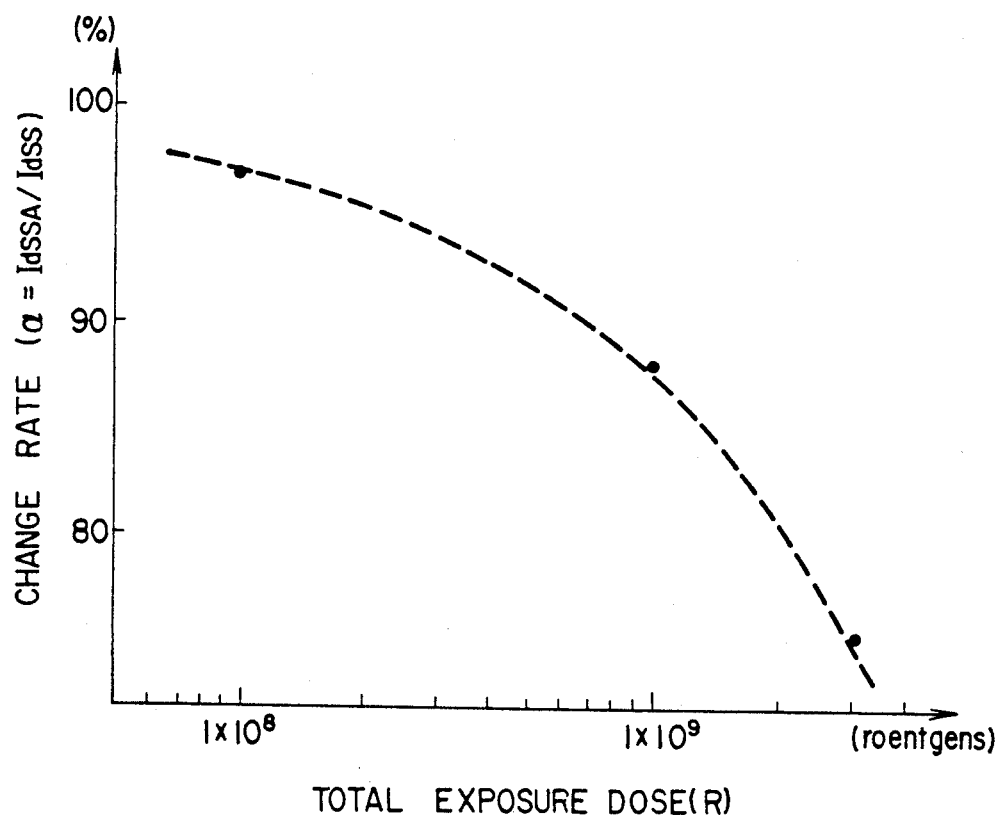
FIG. 5 is a graph showing the relationship of the total exposure dose R and a change rate $\alpha$ of the saturated drain current of the MESFET involved in this invention.
Figure 6:
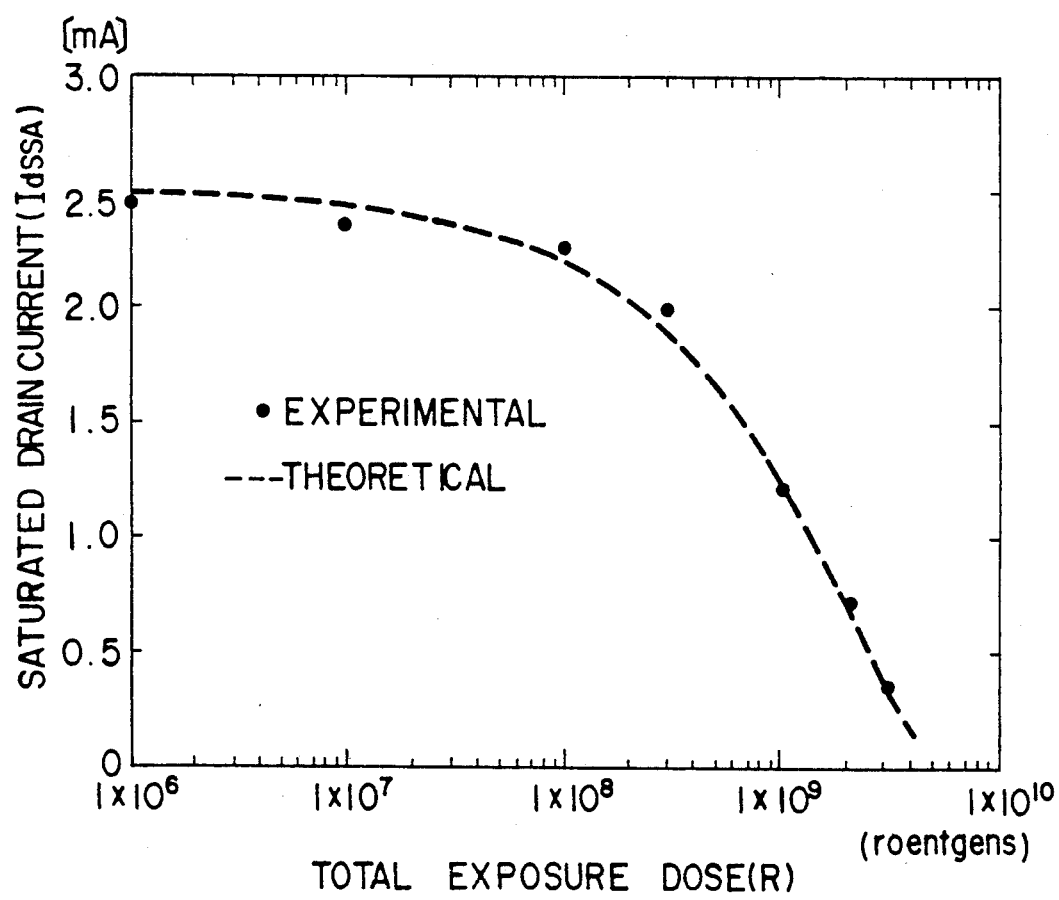
FIG. 6 is a graph showing the relationship of the total exposure dose R and a change of the saturated drain current $I_{dss}$.

Then, the inventors actually measured changes of the saturated drain current $I_{dss}$ due to the radiation exposure of the same GaAs MESFETs as those which exhibited the threshold voltages $V_{th}$ of FIGS. 2 and 4. As a result, the characteristic of the change rate $\alpha$ of the saturated drain current $I_{dss}$ of FIG. 5 was obtained in use of same MESFET of FIG. 2. The change rate $\alpha$ of the saturated drain current $I_{dss}$ of FIG. 6 was obtained in use of same MESFET of FIG. 4. In FIGS. 5 and 6, the black points indicate the experimental values, and the dotted lines indicate the theoretical values given by applying Formula 10 described below to Formula 1.

The theoretical formula for the change rate $\Delta = I_{dssA}/I_{dss}$ of the saturated drain current $I_{dss}$ will be derived below. The saturated drain current $I_{dss}$ of the MESFET is given for an intrinsic FET with a source resistance $R_s$ kept out of consideration, by $$I_{dss} = \{(W_g \cdot \mu \cdot q^2 \cdot N_D^2 \cdot t_a^3)/(6\epsilon \cdot L_g)\} \times \{1 - 3(V_{bi} - V_G)/V_p + 2[(V_{bi} - V_G)/V_p]^{3/2}\} \quad (6)$$

where $W_g$ represents a gate width; $\mu$, an electron mobility in the active layer 2; $L_g$, a gate length; $V_G$, a gate voltage; and $V_p$, a pinch-off voltage. When a saturated drain current $I_{dss}$ for $V_G = V_{bi}$ is represented by $I_{DSS}$ for simplifying the computation, Formula 6 is rewritten into $$I_{DSS} = (W_g \cdot \mu \cdot q^2 \cdot N_D^2 \cdot t_a^3)/(6\epsilon \cdot L_g) \quad (7)$$

when a saturated drain current after the radiation exposure is represented by $I_{DSSA}$, a change rate $\alpha$ due to the radiation exposure is given based on Formula 7 by $$\alpha = I_{DSSA}/I_{DSS} \quad (8)$$
$$= (\mu_A \cdot N_{DA}^2)/(\mu \cdot N_D^2)$$

where $N_{DA}$ is a carrier concentration after the radiation exposure and is given by $$N_{DA} = N_D - \Delta N_D \quad (9)$$

Then Formula 8 is substituted by Formula 9 into $$\alpha = \{(\mu_A(N_D - \Delta N_D)^2)/(\mu \cdot N_D^2)\} \quad (10)$$

Then Formula 10 will be discussed below. It is found that the change rate $\alpha$ is influenced by changes ($\mu \rightarrow \mu_A$) of the electron mobility $\mu$ due to the radiation exposure. But $\mu_A/\mu$ is around 0.95–0.98 when carrier concentration before the radiation exposure is about $1\times 10^{18}$ cm$^{-3}$. The change becomes smaller as the carrier concentration becomes higher. Then the computation was made with $\mu_A/\mu = 0.95$. The results are shown by the dotted lines of FIGS. 5 and 6. As described above, it was confirmed that the results agreed with the experimental values.

These experiments on the saturated drain current $I_{dss}$ and the studies of their results show the following. Firstly, a major cause for the degradation of the $I_{dss}$ of the MESFET as total dose radiation affects is decreases in the carrier concentration of the active layer, and it was found that Formula 1 is very descriptive of the decrease of the carrier concentration due to the radiation exposure. Secondly, the change rate $\alpha$ of the saturated drain current can be set at a required value by setting only the initial carrier concentration (before the radiation exposure) of the active layer, because $\mu$ is a constant in Formula 10, the value of $\mu_A/\mu$ can be approximated, and $\Delta N_D$ can be determined depending on a total radiation dose in Formula 1. Specifically, when the carrier concentration $N_D$ of the active layer 2 is set at about $2\times 10^{17}$ cm$^{-3}$ as in the conventional ones, the radiation hardness is insufficient as seen in FIG. 6. When the carrier concentration $N_D$ is set at $1\times 10^{18}$ cm$^{-3}$, the radiation hardness is outstandingly improved as seen in FIG. 5.

Figure 7:
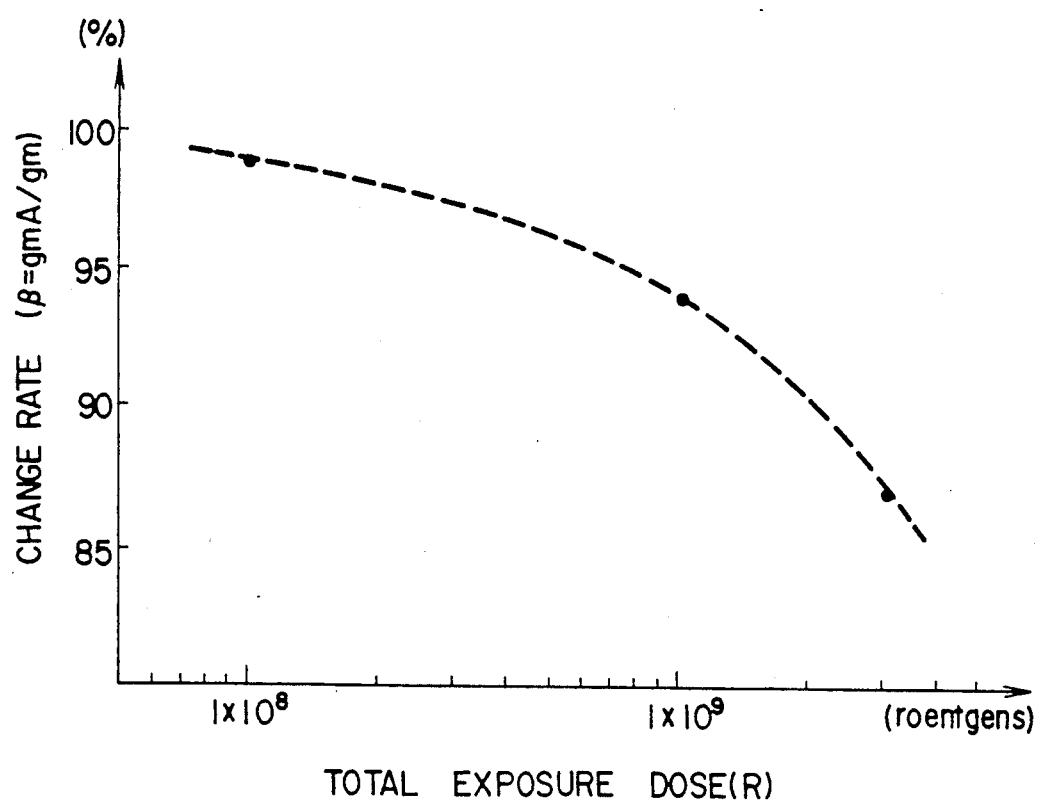
FIG. 7 is a graph showing the relationship of the total exposure dose R and a change rate $\beta$ of the transconductance of the MESFET involved in this invention.
Figure 8:
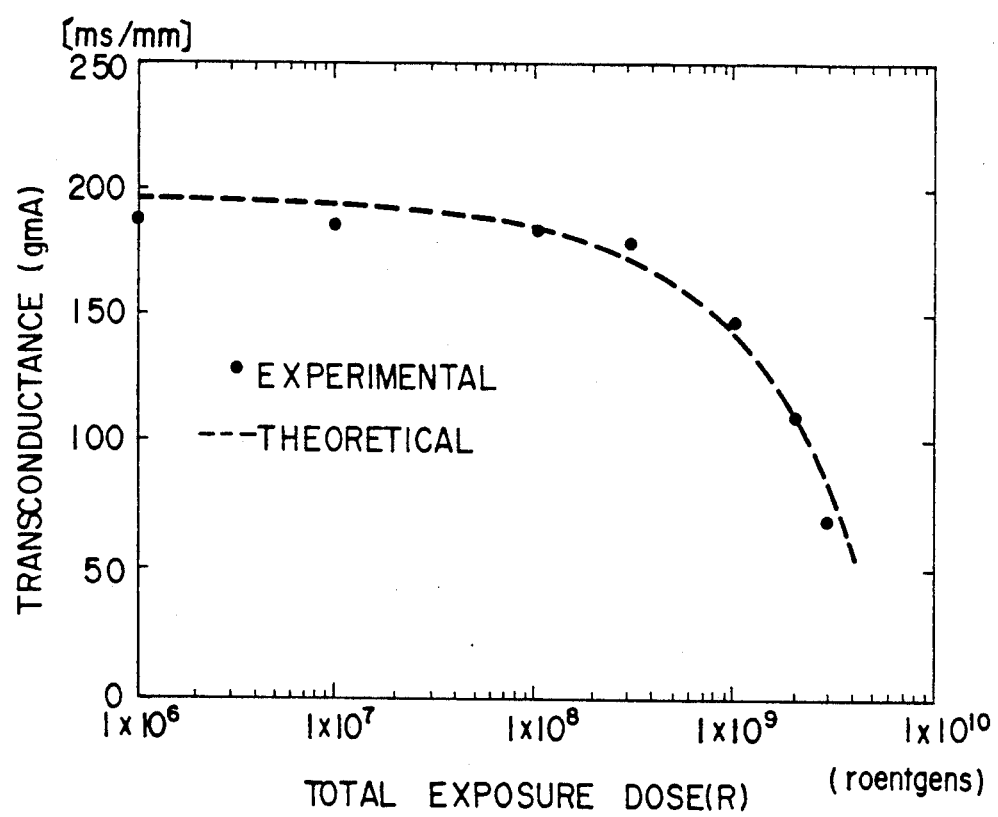
FIG. 8 is a graph showing the results of experiments on the relationship of the total exposure dose R and a change of the transconductance $g_m$ of the conventional MESFET.

Then, the inventors actually measured changes of the transconductances $g_m$ due to the radiation exposure in the saturation regions of the same GaAs MESFETs as those which exhibited the threshold voltages $V_{th}$ of FIGS. 2 and 4 and the saturated drain current $I_{dss}$ characteristics of FIGS. 5 and 6. As results, the change rate $\beta$ of the transconductance $g_m$ of FIG. 7 was obtained in use of same MESFET of FIG. 2 and 5, and the change rate $\beta$ of the transconductance $g_m$ of FIG. 8 was obtained in use of same MESFET of FIG. 4 and 6. In FIGS. 7 and 8, the black points indicate the experimental values, and the dotted lines indicate the theoretical values given by applying Formula 15 described below to Formula 1.

The theoretical formula for the change rate $\beta = g_{mA}/g_m$ of the transconductance will be derived below. A transconductance $g_m$ in the saturation region of the MESFET is given for an intrinsic FET with a source resistance $R_s$ kept out of consideration, by $$g_m = \{(W_g \cdot \mu \cdot q \cdot N_D \cdot t_a)/L_g \times \{1 - [(V_{bi} - V_g)/V_p]^{\frac{1}{2}}\} \quad (11).$$

When a transconductance $g_m$ for $V_G = V_{bi}$ is represented by $g_{mmax}$ for simplifying the computation, Formula 11 is rewritten into $$g_{mmax} = (W_g \cdot \mu \cdot q \cdot N_D \cdot t_a)/L_g \quad (12).$$

A change rate $\beta$ due to the radiation exposure is given based on Formula 12 by $$\beta = g_{mmaxA}/g_{mmax} \quad (13)$$
$$= (\mu_A \cdot N_{DA})/(\mu \cdot N_D)$$

where $N_{DA}$ is a carrier concentration after the radiation exposure and given by $$N_{DA}=N_D-\Delta N_D \quad (14).$$

Then Formula 13 is substituted by Formula 14 into $$\beta=\{\mu_A(N_D-\Delta N_D)\}/(\mu\cdot N_D) \quad (15).$$

Then Formula 15 will be discussed below. It is found that the change rate $\beta$ is influenced by changes ($\mu \rightarrow \mu_A$) of the electron mobility $\mu$ due to the radiation exposure. But $\mu_A/\mu$ is around 0.95 when the carrier concentration before the radiation exposure is about $1\times 10^{18}$cm$^{-3}$. The change becomes smaller as the carrier concentration becomes higher. Then the computation was made with $\mu_A/\mu=0.95$. The results were the dotted lines of FIGS. 7 and 8. As described above, it was confirmed that the results agreed with the experimental values.

These experiments and the studies of their results show the following. Firstly, a major cause for the degradation of the transconductance of the MESFET as a total dose radiation affect is decreases of the carrier concentration in the active layer, and it was found that Formula 1 is very descriptive of the decrease of the carrier concentration due to the radiation exposure. Secondly, the change rate $\beta$ of the transconductance can be set at a required value by setting only the initial carrier concentration of the active layer, because $\mu$ is a constant in Formula 15, the value of $\mu_A/\mu$ can be approximated, and $\Delta N_D$ is determined based on Formula 1, depending on a radiation dose. Specifically, when the carrier concentration $N_D$ of the active layer 2 is set at about $2\times 10^{17}$cm$^{-3}$ as in the conventional ones, the radiation hardness is insufficient as seen in FIG. 8. When the carrier concentration $N_D$ is set at $1\times 10^{18}$cm$^{-3}$, the radiation hardness is outstanding improved as seen in FIG. 7.

It is possible that, based on the above described findings, a structure of a semiconductor device which is able to operate normally under the radiation exposure of a total dose R not only below $1\times 10^9$ roentgens but also a total dose R above $1\times 10^9$ roentgens can be specified based on a thickness $t_a$ of the active layer 2 and a carrier concentration $N_D$. That is, in order that a GaAs MESFET and a signal processing circuit are combined into such semiconductor device, and the signal processing circuit can operate as designed when a tolerable change amount of the threshold voltage $V_{th}$ of the MESFET is $V_{thL}$, an effective thickness $t_a$ of the active layer 2 must be $$t_a<\{(2\epsilon\cdot\Delta V_{thL})/(q\cdot\Delta N_D)\}^{\frac{1}{2}} \quad (16),$$

based on Formula 5. In this case, the carrier concentration $N_D$ of the active layer 2 is given as follows based on Formula 2 by $$N_D=\{[2\epsilon/(q\cdot t_a^2)]\cdot(V_{bi}-V_{th})\} \quad (17)$$

Here, when a tolerable change amount $\Delta V_{thL}$ of the threshold voltage $V_{th}$ for a total exposure dose of $R=1\times 10^9$ roentgens is specifically computed by $$\Delta V_{thL}=0.1V(\Delta V_{th}<0.1V),$$

a change amount $\Delta N_D$ of the carrier concentration is given by $$\Delta N_D=3.87\times 10^{16}\text{cm}^{-3}.$$

An effective thickness $t_a$ of the active layer 2 is given below 767 Å (500 Å for the MESFET of FIG. 2), based on Formula 16. Further, with a thickness of the active layer 2 set at below 767 Å, when the threshold voltage $V_{th}$ is given $$V_{th}=-1.2V,$$

a carrier concentration $N_D$ of the active layer 2 is given $4.28\times 10^{17}$cm$^{-3}$ by Formula 17, where
a dielectric constant of the active layer $$\epsilon = \epsilon_s\cdot\epsilon_0$$
$$= 12.0\times 8.85\times 10^{-12} F/m$$

an electron charge
$q\times 1.602\times 10^{-19}$C, and
a built-in voltage $V_{bi}=0.7V$.

In order that the combination circuit which relates to the semiconductor device operates as required when a tolerable change rate of the saturated drain current $I_{dss}$ of the MESFET is represented by $\alpha_L$, an initial carrier concentration $N_D$ of the active layer 2 must be, based on Formula 10 by $$N_D>\Delta N_D/\{1-[\alpha_L(\mu/\mu_A)]^{\frac{1}{2}}\} \quad (18).$$

In this case, an effective thickness $t_a$ of the active layer 2 is given by $$t_a=\{[2\epsilon/(q\cdot N_D)](V_{bi}-V_{th})\} \quad (19).$$

Here, for a total exposure dose of $R=1\times 10^9$ roentgens, with $\alpha_L$ (a tolerable change rate of the saturated drain current $I_{DSS}$)=0.9 ($I_{DSSA}>0.9I_{DSS}$), a change amount $\Delta N_D$ of the carrier concentration is given based on Formula 1 by $$\Delta N_D=3.87\times 10^{16}\text{cm}^{-3}.$$

and the carrier concentration of the active layer 2 becomes above $8.84\times 10^{18}$cm$^{-3}$ based on Formula 10. With this carrier concentration, when the threshold voltage $V_{th}$ is given $$V_{th}=-1.2V.$$

the effective thickness of the active layer 2 is given 546 Å based on Formula 19.

Further, in order that the GaAs MESFET and a signal processing circuit are combined into this semiconductor device, and the signal processing circuit can operate as designed when a tolerable change rate of the transconductance $g_m$ in the saturation region of the MESFET is $\beta_L$, an initial carrier concentration $N_D$ of the active layer 2 must be, based on Formula 15, $$N_D>\Delta N_D/\{1-\beta_L(\mu/\mu_A)\} \quad (21).$$

In this case, an effective thickness $t_a$ of the active layer 2 must be $$t_a=\{[\epsilon/(q\cdot N_D)](V_{bi}-V_{th})\}^{\frac{1}{2}} \quad (22).$$

Here, for a total exposure dose of $R=1\times 10^9$ roentgens, with $\beta_L$ (a tolerable change rate of the transconductance $g_{mmax}$)=0.9 ($g_{mmaxA}>0.9\ g_{mmax}$), a change amount $\Delta N_D$ is given by $$\Delta N_D = 3.87 \times 10^{16} \text{cm}^{-3}$$

based on Formula 1. The carrier concentration of the active layer 2 is given above $4.50 \times 10^{17} \text{cm}^{-3}$ by Formula 15. With the carrier concentration of the active layer 2 above this value and with the threshold voltage $V_{th}$ given $$V_{th} = -1.2 \text{V},$$

an effective thickness $t_a$ of the active layer 2 is given 529 Å by Formula 22.

Figure 9:
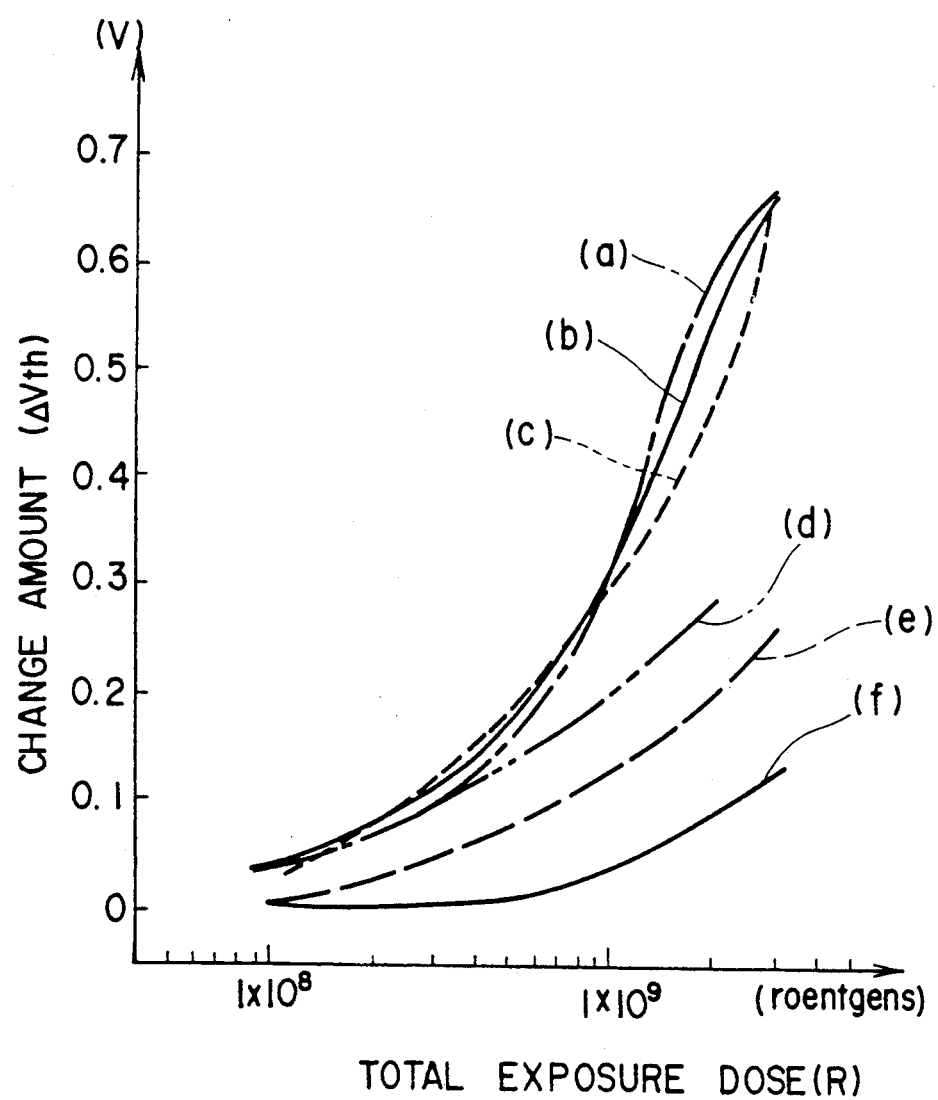
FIGS. 9 to 11 are characteristic curves of the threshold voltage, saturated drain current, and transconductance of the MESFET involved in this invention and of the conventional FETs for comparison in radiation hardness.
Figure 10:
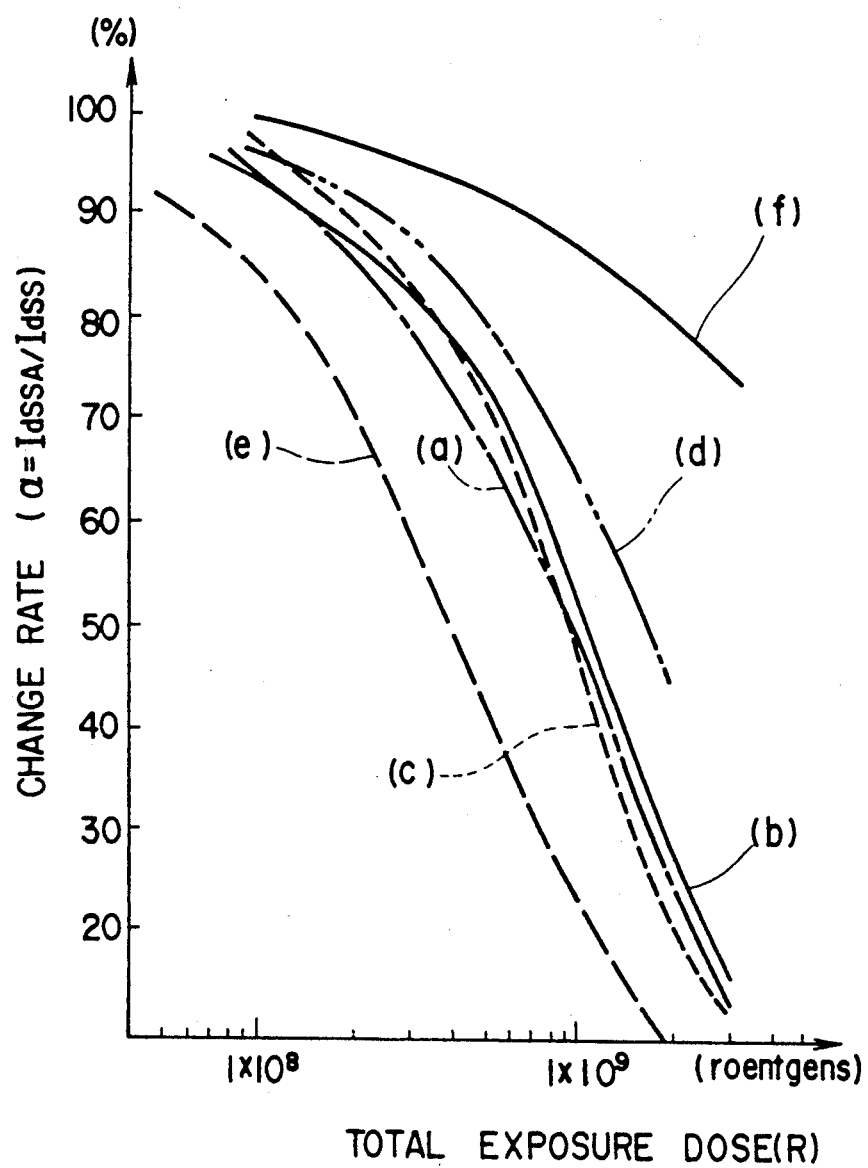
Figure 11:
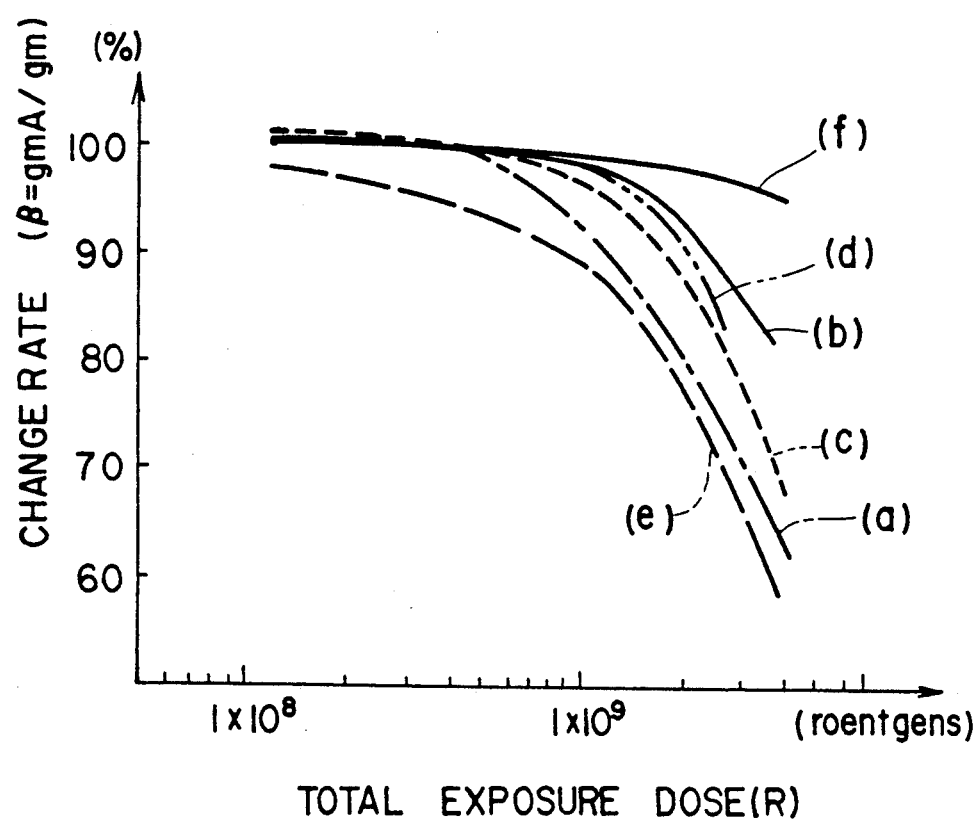

The semiconductor device according to this invention and the conventional ones will be compared in radiation hardness in FIGS. 9 to 11. FIG. 9 shows change amounts $\Delta V_{th}$ of the threshold voltage $V_{th}$ due to the radiation exposure. FIG. 10 shows change rates $\alpha$ of the saturated drain current $I_{dss}$. FIG. 11 shows change rates $\beta$ of the transconductance $g_m$. In FIGS. 9 to 11, curves (a), (b) and (c) show characteristics of the conventional commercial MESFETs. The curve (b) corresponds to the characteristics of FIGS. 4, 6 and 8 for the active layer 2 of a 1130 Å effective thickness $t_a$ and a carrier concentration of $2.09 \times 10^{17} \text{cm}^{-3}$. The curve (d) shows the characteristics of a conventional HEMT (high electron mobility transistor). As evident from FIG. 9, these conventional semiconductor devices have change amounts $\Delta V_{th}$ of the threshold voltage as high as 0.2 to 0.3 V for a total dose of $R = 1 \times 10^9$ roentgens. The curve (e) in FIG. 9 shows the characteristic of a MESFET having a p-type layer buried below an n-type active layer for decreasing leakage current to the substrate, and the change amount $\Delta V_{th}$ is suppressed to about 0.12 V for $R = 1 \times 10^9$ roentgens. In contrast to this, in the MESFET according to this invention having the active layer 2 of an effective thickness $t_a$ of 500 Å (corresponding to the characteristic of FIG. 2), the change amount $\Delta V_{th}$ is suppressed to a value lower than 0.1 V even for $R = 1 \times 10^9$ roentgens as indicated by the curve (f), and it is found that the radiation hardness is much improved. It is evident from FIGS. 10 and 11 that such improvement in the radiation hardness is also exhibited in the saturated drain current $I_{dss}$ and the transconductance $g_m$.

In this invention, even under the radiation exposure of a total exposure dose equal to or higher than $R = 1 \times 10^8$ roentgens, the values of the threshold voltage $V_{th}$, saturated drain current $I_{dss}$ and transconductance $g_m$ remain within their tolerable ranges. A GaAs MESFET which is acknowledged as superior in radiation hardness characteristics must have radiation hardness for a total exposure dose of about $1.4 \times 10^8$ to $4.3 \times 10^9$ roentgens. For this exposure dose, the absorbed dose of GaAs is totally $1 \times 10^8$ to $3 \times 10^9$ rad (1 roentgen = 0.7 rads. in GaAs). On the other hand, the tolerable range of the change (positive shift) amount $\Delta V_{th}$ of the threshold voltage $V_{th}$ is 0.2 V, and the tolerable ranges of the change rates $\alpha = I_{dss}/I_{dss}$, $\beta = g_{mA}/g_m$ of the saturated drain current $I_{dss}$ and the transconductance $g_m$ are about 80%. Specifically, when the change amount $\Delta V_{th} = 0.15$ V with a total exposure dose $R = 1.5 \times 10^9$ roentgens, it can be said that the GaAs MESFET has superior radiation hardness.

But what has to be noted here is that the above described tolerable change amount $\Delta V_{thL}$, and the tolerable change rates $\alpha_L$, $\beta_L$ greatly vary depending on circuits combined with the GaAs MESFET. Specifically, one example is SCFL (Source coupled FET Logic) circuits which have low integrity but have enabled high speed operation. In these circuits, the operation speed is substantially determined by a current flowing two transistors in the buffer stages. Accordingly, when values of the $V_{th}$, $I_{dss}$ and $g_m$ vary due to a radiation exposure, the operation speed greatly varies. But the influence on the operation speed by the changes of values of $V_{th}$, $I_{dss}$ and $g_m$ can be reduced by $\frac{1}{3}$ to $\frac{1}{4}$ by setting the values of resistors of the SCFL circuit at suitable values. Consequently, even in a SCFL circuit which allows for a change of the operation speed of only 10%, the tolerable change is 200 m/V for the threshold voltage $V_{th}$ ($V_{thL} = 0.2$ V), and the tolerable changes for the saturated drain current $I_{dss}$ and the transconductance $g_m$ are about 20% ($\beta_L = 0.8$, $\beta_L = 0.8$).

By contrast, another example is a memory cell for a memory IC which has high integrity on a semiconductor chip, the tolerable range for those changes are narrowed. Specifically, in this IC, a time in which one small memory cell charges and discharges the data lines occupies a large part of a total access time. Furthermore, each memory cell has transistors, resistors, etc. miniaturized for reducing power consumption. Consequently, the operation speed greatly varies depending on changes of the parameters. Specifically, in order to keep the change of the memory access time within 20%, the tolerable change amount of the threshold voltage $V_{th}$ is only 50 mV ($\Delta V_{thL} = 0.05$ V), and the tolerable change rates of the saturated drain current $I_{dss}$ and the transconductance $g_m$ are only 10% ($\alpha_L = 0.9$, $\beta_L = 0.9$).

This invention is not limited to the above described embodiment and covers various modifications.

For example, the active layer is not necessarily formed by epitaxial growth but may be formed by ion implantation. The recess structure of FIG. 1 is not essential.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A semiconductor device including a MESFET which has an active layer comprising GaAs crystal that is substantially evenly doped in a depth direction to have a carrier concentration $N_D$, and a threshold voltage $V_{th}$, and which normally operates when a change $\Delta V_{th}$ in the threshold voltage is within a tolerable amount $\Delta V_{thL}$, an effective thickness $t_a$ of the active layer being
$$t_a < \{2\epsilon \cdot \Delta V_{thL} / (q \cdot \Delta N_D)\}^{\frac{1}{2}}$$
where $\Delta N_D$ represents a decrease in the carrier concentration $N_D$ due to radiation exposure of a total exposure dose R equal to or higher than $1 \times 10^9$ roentgens, $\epsilon$ represents a dielectric constant of the active layer and q represents an electron charge.

2. A semiconductor device according to claim 1, wherein the decrease $\Delta N_D$ in the carrier concentration $N_D$ is given by $$\Delta N_D = b \cdot R^c$$

where b and c are constants.

3. A semiconductor device according to claim 2, wherein the constants b and c are $1.99 \times 10^{10} \leq b \leq 3.98 \times 10^{10}$ $0.5 \leq c \leq 0.8$.

4. A semiconductor device including a MESFET which has an active layer comprising GaAS crystal that is substantially evenly doped in a depth direction, and which normally operates when a change rate $\alpha = I_{dssA}/I_{dss}$ of a saturated drain current $I_{dss}$ of the MESFET where $I_{dssA}$ represents the value to which the saturated drain current $I_{dss}$ has changed, is within a tolerable rate $\alpha_L$, a carrier concentration $N_D$ of the active layer before radiation exposure is given by $$N_D > \Delta N_D / \{1 - [\alpha_L(\mu/\mu_A)]^{\frac{1}{2}}\}$$

where $\Delta N_D$ represents a decrease in the carrier concentration of the active layer due to radiation exposure of a total exposure dose R equal to or higher than $1 \times 10^9$ roentgens, and $\mu$ and $\mu_A$ represent carrier mobilities in the active layer respectively before and after the radiation exposure.

5. A semiconductor device according to claim 4, wherein a decrease $\Delta N_D$ in the carrier concentration is given by $$\Delta N_D = b \cdot R^c$$

where b and c are constants.

6. A semiconductor device according to claim 5, wherein the constants b and c are $1.99 \times 10^{10} \leq b \leq 3.98 \times 10^{10}$ $0.5 \leq c \leq 0.8$ 7. A semiconductor device including a MESFET which has an active layer comprising GaAs crystal that is substantially evenly doped in a depth direction, and which normally operates when a change rate $\beta = g_{mA}/g_m$ of a transconductance $g_m$ in the saturation region of the MESFET, where $g_{mA}$ represents the value to which the transconductance $g_m$ has changed, is within a tolerable rate $\beta_L$, a carrier concentration $N_D$ of the active layer before radiation exposure is given by $$N_D > \Delta N_D / \{1 - \beta_L(\mu/\mu_A)\}$$

where $\Delta N_D$ represents a decrease in the carrier concentration of the active layer due to radiation exposure of a total exposure dose R equal to or higher than $1 \times 10^9$ roentgens, and $\mu$ and $\mu_A$ represent carrier mobilities in the active layer respectively before and after the radiation exposure.

8. A semiconductor device according to claim 7, wherein a decrease $\Delta N_D$ in the carrier concentration is given by $$\Delta N_D = b \cdot R^c$$

where b and c are constants.

9. A semiconductor device according to claim 8, wherein the constants b and c are $1.99 \times 10^{10} \leq b \leq 3.98 \times 10^{10}$ $0.5 \leq c \leq 0.8$.

10. A semiconductor device including a MESFET which has an active layer comprising GaAs crystal that is substantially evenly doped in a depth direction to have a carrier concentration $N_D$, and a threshold voltage $V_{th}$, and which normally operates when a change $\Delta V_{th}$ in the threshold voltage is within a tolerable amount $\Delta V_{thL}$, and a change rate $\alpha = I_{dssA}/I_{dss}$ of a saturated drain current $I_{dss}$ of the MESFET where $I_{dssA}$ represents the value to which the saturated drain current $I_{dss}$ has changed, is within a tolerable rate $\alpha_L$, where $\Delta N_D$ represents a decrease in the carrier concentration of the active layer due to radiation exposure of a total exposure dose R equal to or higher than $1 \times 10^9$ roentgens, $\mu$ and $\mu_A$ represent carrier mobilities in the active layer respectively before and after the radiation exposure, $\epsilon$ represents a dielectric constant of the active layer, and q represents an electron charge, an effective thickness $t_a$ of the active layer being $$t_a < \{(2\epsilon \cdot \Delta V_{thL})/(q \cdot \Delta N_D)\}^{\frac{1}{2}}$$

and, a carrier concentration $N_D$ of the active layer before the radiation exposure is given by $$N_D > \Delta N_D / \{1 - [\alpha_L(\mu/\mu_A)]^{\frac{1}{2}}\}.$$

11. A semiconductor device according to claim 10, wherein a decrease $\Delta N_D$ in the carrier concentration is given by $$N_D = b \cdot R^c$$

where b and c are constants.

12. A semiconductor device according to claim 11, wherein the constants b and c are $1.99 \times 10^{10} \leq b \leq 3.98 \times 10^{10}$ $0.5 \leq c \leq 0.8$.

13. A semiconductor device including a MESFET which has an active layer comprising GaAs crystal that is substantially evenly doped in a depth direction to have a carrier concentration $N_D$, and a threshold voltage $V_{th}$, and which normally operates when a change $\Delta V_{th}$ in the threshold voltage is within a tolerable amount $\Delta V_{thL}$, and a change rate $\beta = g_{mA}/g_m$ of a transconductance $g_m$ represents a transconductance to which the transconductance $g_m$ has changed, is within a tolerable rate $\beta_L$, where a decrease $\Delta N_D$ in the carrier concentration due to radiation exposure of a total exposure dose R equal to or higher than $1 \times 10^9$ roentgens, $\mu$ and $\mu_A$ represent carrier mobilities in the active layer respectively before and after the radiation exposure, $\epsilon$ represents a dielectric constant of the active layer, and q represents an electron charge, an effective thickness $t_a$ of the active layer being $$t_a < \{2\epsilon \cdot \Delta V_{thL})/(q \cdot \Delta N_D)\}^{\frac{1}{2}},$$

and a carrier concentration $N_D$ of the active layer before the radiation exposure being
$N_D > \Delta N_D / \{1 - \delta_L(\mu/\mu_A)\}.$ 14. A semiconductor device according to claim 13, wherein a decrease $\Delta N_D$ in the carrier concentration is given by $$\Delta N_D = b \cdot R^c$$

where b and c are constants.

15. A semiconductor device according to claim 14, wherein the constants b and c are $1.99 \times 10^{10} \leq b \leq 3.98 \times 10^{10}$ $0.5 \leq c \leq 0.8$.

16. A semiconductor device including a MESFET having an active layer comprising GaAs crystal that is substantially evenly doped in a depth direction, and which normally operates when a change rate $\alpha = I_{dssA}/I_{dss}$ of a saturated drain current $I_{dss}$ of the MESFET where $I_{dssA}$ represents the value to which the saturated drain current $I_{dss}$ has changed, is within a tolerable rate $\alpha_L$, and a change rate $\beta = g_{mA}/g_m$ of a transconductance in the saturation region of the MESFET where $g_{mA}$ represents the value to which the transconductance $g_m$ has changed, is within a tolerable rate $\beta_L$, a carrier concentration $N_D$ of the active layer before radiation exposure being $$N_D > \Delta N_D / \{1 - [\alpha_L(\mu/\mu_A)]^{\frac{1}{2}}\},$$

and
$$N_D > \Delta N_D / \{1 - \beta_L(\mu/\mu_A)\}$$

where $N_D$ represents a decrease in the carrier concentration of the active layer due to radiation exposure of a total exposure dose R equal to or higher than $1 \times 10^9$ roentgens, and $\mu$ and $\mu_A$ represent carrier mobilities in the active layer respectively before and after the radiation exposure.

17. A semiconductor device according to claim 16, wherein a decrease $\Delta N_D$ in the carrier concentration is given by $$\Delta N_D = b \cdot R^c$$

where b and c are constants.

18. A semiconductor device according to claim 17, wherein the constants b and c are $1.99 \times 10^{10} \leq b \leq 3.98 \times 10^{10}$ $0.5 \leq c \leq 0.8$.

19. A semiconductor device including a MESFET having an active layer comprising GaAs crystal that is substantially evenly doped in a depth direction to have a carrier concentration $N_D$, and a threshold voltage $V_{th}$, and which normally operates when a change $\Delta V_{th}$ in the threshold voltage is within a tolerable amount $\Delta V_{thL}$, a change rate $\alpha = I_{dssA}/I_{dss}$ of a saturated drain current $I_{dss}$ of the MESFET where $I_{dssA}$ represents the value to which the saturated drain current $I_{dss}$ has changed, is within a tolerable rate $\alpha_L$, and a change rate $\beta = g_{mA}/g_m$ of a transconductance $g_m$ in the saturation region of the MESFET where $g_{mA}$ represents the value to which the transconductance $g_m$ has changed, is within a tolerable rate $\beta_L$, wherein $\Delta N_D$ represents a decrease in the carrier concentration $N_D$ due to radiation exposure of a total exposure dose R equal to or higher than $1 \times 10^9$ roentgens, $\mu$ and $\mu_A$ represent carrier mobilities in the active layer respectively before and after the radiation exposure, $\epsilon$ represents a dielectric constant of the active layer, and q represents an electron charge, an effective thickness $t_a$ of the active layer being $$t_a < \{(2\epsilon \cdot \Delta V_{thL})/(q \cdot \Delta N_D)\}^{\frac{1}{2}},$$

and a carrier concentration $N_D$ of the active layer before the radiation exposure being $$N_D > \Delta N_D \{1 - [\alpha_L(\mu/\mu_A)]^{\frac{1}{2}}\}$$

and $$N_D > \Delta N_D / \{1 - \beta_L(\mu/\mu_A)\}.$$

20. A semiconductor device according to claim 19, wherein a decrease $\Delta N_D$ in the carrier concentration is given by $$\Delta N_D = b \cdot R^c$$

where b and c are constants.

21. A semiconductor device according to claim 20, wherein the constants b and c are $1.99 \times 10^{10} \leq b \leq 3.98 \times 10^{10}$ $0.5 \leq c \leq 0.8$.

22. A semiconductor device according to claim 2, wherein the constants b and c are $5 \times 10^5 \leq b \leq 1 \times 10^6$ $1.0 \leq c \leq 1.3$.

23. A semiconductor device according to claim 5, wherein the constants b and c are $5 \times 10^5 \leq b \leq 1 \times 10^6$ $1.0 \leq c \leq 1.3$.

24. A semiconductor device according to claim 8, wherein the constants b and c are $5 \times 10^5 \leq b \leq 1 \times 10^6$ $1.0 \leq c \leq 1.3$.

25. A semiconductor device according to claim 11, wherein the constants b and c are $5 \times 10^5 \leq b \leq 1 \times 10^6$ $1.0 \leq c \leq 1.3$.

26. A semiconductor device according to claim 14, wherein the constants b and c are $5 \times 10^5 \leq b \leq 1 \times 10^6$ $1.0 \leq c \leq 1.3$.

27. A semiconductor device according to claim 17, wherein the constants b and c are $5 \times 10^5 \leq b \leq 1 \times 10^6$ $1.0 \leq c \leq 1.3$.

28. A semiconductor device according to claim 20, wherein the constants b and c are $5 \times 10^5 \leq b \leq 1 \times 10^6$ $1.0 \leq c \leq 1.3$.

* * * * *